(12) United States Patent
Gross et al.

(10) Patent No.: US 10,838,002 B2
(45) Date of Patent: Nov. 17, 2020

(54) BURN-IN PREFORM AND METHOD OF MAKING THE SAME

(71) Applicant: Indium Corporation, Utica, NY (US)

(72) Inventors: Thomas R. Gross, Utica, NY (US); Robert Jarrett, Utica, NY (US); Anthony D. Lanza, Jr., Utica, NY (US); Craig K. Merritt, Utica, NY (US)

(73) Assignee: INDIUM CORPORATION, Utica, NY (US)

( * ) Notice: Subject to any disclaimer, the term of this patent is extended or adjusted under 35 U.S.C. 154(b) by 0 days.

(21) Appl. No.: 16/175,460

(22) Filed: Oct. 30, 2018

(65) Prior Publication Data

US 2019/0128953 A1 May 2, 2019

Related U.S. Application Data

(60) Provisional application No. 62/579,076, filed on Oct. 30, 2017.

(51) Int. Cl.
*G01R 31/28* (2006.01)
*G01K 7/01* (2006.01)
*H01L 23/532* (2006.01)
*H01L 23/00* (2006.01)
*H01L 23/488* (2006.01)

(52) U.S. Cl.
CPC ......... *G01R 31/2872* (2013.01); *G01K 7/015* (2013.01); *H01L 23/488* (2013.01); *H01L 23/53238* (2013.01); *H01L 23/53252* (2013.01); *H01L 23/564* (2013.01)

(58) Field of Classification Search
CPC ............ G01R 31/2886; G01R 31/2863; G01R 31/2855; G01R 31/286; G01R 31/2817
See application file for complete search history.

(56) References Cited

U.S. PATENT DOCUMENTS

| 6,255,208 B1 * | 7/2001 | Bernier | H01L 24/11 |
| | | | 257/E21.508 |
| 2012/0081137 A1 * | 4/2012 | Pagani | G06F 11/26 |
| | | | 324/750.01 |

* cited by examiner

*Primary Examiner* — Jae Lee
(74) *Attorney, Agent, or Firm* — Sheppard, Mullin, Richter & Hampton LLP

(57) ABSTRACT

Some implementations are directed to a burn-in solder preform including: a barrier layer to prevent thermally conductive material from adhering to a semiconductor component during burn-in testing; and a thermally conductive cladding layer attached to a portion of the barrier layer such that at least one dimension of the barrier layer extends past the thermally conductive cladding layer, where the thermally conductive cladding layer is attached over the barrier layer through continuous attachment or spot attachment. In some implementations, a method includes: placing the aforementioned burn-in solder preform between a test fixture and a semiconductor component; attaching a portion of the barrier layer of the burn-in solder preform to a head of the text fixture; and after attaching a portion of the barrier layer of the burn-in solder preform to the head of the test fixture, performing burn-in testing of the semiconductor component.

20 Claims, 5 Drawing Sheets

BURN-IN PREFORM AND METHOD OF MAKING THE SAME

CROSS REFERENCE TO RELATED APPLICATIONS

This application claims priority to U.S. Provisional Application No. 62/579,076, filed on Oct. 30, 2017, which is incorporated herein by reference in its entirety.

TECHNICAL FIELD

The present disclosure relates generally to systems and methods for performing post-production analysis on electronic devices. More particularly, the technology is directed to a solder preform configured to perform burn-in analysis on semiconductor devices.

DESCRIPTION OF THE RELATED ART

It is common in the electronics industry to perform post-test analysis on installed semiconductor devices such as, for example, microprocessor chips, to determine chip performance (e.g., processor speed). One such method of post-test analysis employs a special fixture that houses numerous resistance temperature detectors (RTDs). To protect the RTDs and shield them from extreme temperatures during post-test analysis, special solder preforms, commonly referred to as "burn-in preforms," are secured to the fixture. These unique burn-in preforms consist of a thermally conductive layer and barrier layer.

Presently, there are two methods for producing a burn-in preform and securing it to a fixture head. The first method employs cladding a thermally conductive material, such as indium metal, to a barrier layer, such as aluminum, creating a 100% composite material. This method is often cost prohibitive since the entire preform is completely clad with thermally conductive material. Furthermore, when the thermally-clad preform is wrapped around the test fixture, it can cover certain RTD/thermal sensors and interfere with their operation. Lastly, because the preform is mostly clad with thermally conductive material, high temperatures during testing can cause the thermally conductive material to reflow/melt and attach to the RTDs located on the side of the test fixture.

The second method employs a labor-intensive process that requires the user to keep the thermally conductive layer and barrier layer assembled and aligned prior to and during placement on the fixture head through use of a clamping mechanism. However, properly aligning the layers during assembly can be difficult and time consuming, often resulting in wasted material. Furthermore, clamping the layers while holding the test fixture can cause tears in the barrier layer during assembly. As a result, the cost and time required for final assembly by the customer is typically higher.

BRIEF SUMMARY OF THE DISCLOSURE

Embodiments described herein are directed to systems and methods for producing a burn-in solder preform.

In one embodiment, a burn-in solder preform includes: a barrier layer to prevent thermally conductive material from adhering to a semiconductor component during burn-in testing; and a thermally conductive cladding layer attached to a portion of the barrier layer such that at least one dimension of the barrier layer extends past the thermally conductive cladding layer, wherein the thermally conductive cladding layer is attached over the barrier layer through continuous attachment or spot attachment. In implementations, continuous attachment includes mechanical attachment around all or part of an outer edge of the thermally conductive cladding layer. The mechanical attachment may include pressure attachment.

The thermally conductive layer may be centered over the barrier layer such that at least one portion of the barrier layer underneath the thermally conductive layer extends past the thermally conductive layer, wherein the thermally conductive layer is spot attached along edges to the barrier layer. The burn-in solder preform may consist of the barrier layer and the thermally conductive cladding layer.

In one embodiment, a method includes: attaching a thermally conductive cladding layer over a center of a barrier layer to form a burn-in solder preform, where after attachment, at least one dimension of the barrier layer extends past the thermally conductive cladding layer; placing the burn-in solder preform between a test fixture and a semiconductor component; attaching a portion of the barrier layer of the burn-in solder preform to a head of the text fixture; and after attaching a portion of the barrier layer of the burn-in solder preform to the head of the test fixture, performing burn-in testing of the semiconductor component. In some implementations, attaching the portion of the barrier layer to the head of the text fixture, includes: folding up portions of the barrier layer not covered with the thermally conductive cladding layer to attach to the head of the test fixture.

In implementations, the barrier layer comprises aluminum or an aluminum alloy, and the thermally conductive cladding layer comprises indium or an indium alloy.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present disclosure, in accordance with one or more various embodiments, is described in detail with reference to the following figures. The drawings are provided for purposes of illustration only, and merely depict typical or example embodiments. These drawings are provided to facilitate the reader's understanding of various embodiments and shall not be considered limiting of the breadth, scope, or applicability of the present disclosure. It should be noted that for clarity and ease of illustration these drawings are not necessarily made to scale.

The figures are not exhaustive and do not limit the present disclosure to the precise form disclosed.

DETAILED DESCRIPTION OF THE EMBODIMENTS

Embodiments of the technology disclosed herein are directed toward devices and methods for providing a solder preform that may be used in semiconductor post-production analysis. The modern integrated circuit has created an immense market for semiconductor devices. To keep costs low for consumers, high volume product manufacturing is necessary. Despite mass production, semiconductor applications increasingly demand higher reliability and sustained performance. To ensure sustained performance and reliability, companies routinely perform post-production analysis on newly produced semiconductors. Although there are several methods for post-production analysis, one method employs a test fixture with multiple resistance temperature detectors (RTDs) secured to it. RTDs detect slight variations in temperature and are commonly used in semiconductor post-production applications because of their accuracy, repeatability, and stability. To protect the RTDs and shield them from extreme temperatures during post-production analysis, solder "burn-in" preforms are secured to the fixture heads. The burn-in preforms are specially designed for semiconductor post-production analysis, and consist of a thermally conductive cladding layer and a barrier layer. As mentioned above, there are currently two methods for forming a burn-in preform. The first method consists of forming a 100% composite material clad with thermally conductive material which can lead to inaccurate measurements during burn-in analysis. The second method is reliant upon a user holding the layers together when mounting the preform to the fixture, resulting in misalignment of the conductive material, inaccurate RTD temperature readings, and tearing of the thinner barrier layer. Both methods are cost prohibitive. Accordingly, there is a need in the art for a burn-in preform that comprises both layers preassembled in a way that eliminates inaccurate temperature readings and protects both the post-production analysis equipment and the semiconductor device during testing.

Embodiments of the technology disclosed herein present a solder burn-in preform that includes a thermally conductive cladding layer pre-attached to a barrier layer at a desired location and orientation.

FIGS. 1A-1E illustrate various examples of burn-in solder preforms 100-1, 100-2, 100-3, 100-4 (generally referred to as a burn-in solder preform "100") including a barrier layer 112-1, 112-2, 112-3, and 112-4 (generally referred to as a "barrier layer 112") and thermally conductive cladding layer 124-1, 124-2, 124-3, and 124-4 (generally referred to as a "thermally conductive cladding layer 124") that may be implemented in accordance with the disclosure.

Figure 1A:
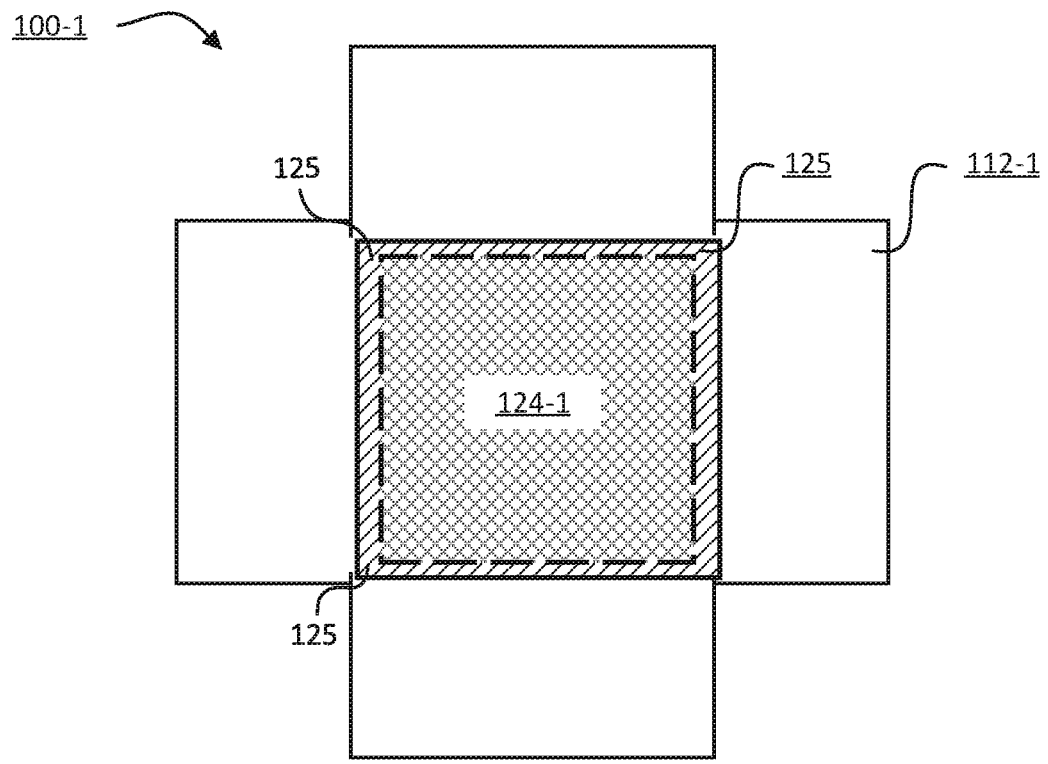
FIG. 1A illustrates an example burn-in solder preform according to embodiments of the disclosure.

FIG. 1A depicts an example solder burn-in preform 100-1 in accordance with the technology disclosed herein. As illustrated, the burn-in solder preform 100-1 in various embodiments may include a barrier layer 112-1 and a thermally conductive cladding layer 124-1. In various embodiments, the thermally conductive cladding layer 124-1 is attached to the barrier layer 112-1 such that thermally conductive cladding layer 124-1 is centered on top of the barrier layer 112-1 prior to being secured to a fixture head. In embodiments, the thermally conductive cladding layer 124-1 may be continuously attached or spot attached to the barrier layer 112-1 around all or part of its outer edge.

As illustrated, attachment points are limited to discrete attachment locations such that the entire thermally conductive cladding layer 124-1 is not 100% attached to the barrier layer 112-1 forming a composite material. For example, the thermally conductive cladding layer 124 may be attached to the barrier layer 112-1 around its edges (e.g., in in one embodiment limited to only the edges), or at specific locations along its surface. In the illustrated example, thermally conductive cladding 124-1 is pre-attached to barrier layer 112-1 in pre-attachment area 125.

By virtue of attaching thermally conductive cladding layer 124-1 over a selected area of barrier layer 112-1, various advantages may be achieved. First, less of thermally conductive cladding layer material (e.g., indium) may be utilized in the attachment, thereby saving in costs. Second, as will be further appreciated from the discussion below, when the cladding layer is smaller than the barrier layer (e.g., centered in a specific area), the cladding layer may be configured to be smaller than a test head of a burn-in testing instrument. This may be particularly advantageous in cases where the test temperature is high enough to melt the material of the thermally conductive cladding layer (e.g., indium). Due to its smaller size, and only being centered, the cladding layer material may not melt on the sides of the test head and create a solder attachment to sides of the test head fixture.

Another advantage of this design is that various configurations of a burn-in solder preform, illustrated herein may be designed to fold around a test head and be clamped. Yet another advantage that may be provided by implementations described herein is that only a critical test area (e.g., center of preform) needs to have the cladding layer (e.g., indium) attached. Additionally, the attachment only needs to be in defined spots to hold the two components together long enough until the assembly is placed on a test fixture head assembly.

Yet a further advantage of the present design is that it may prevent barrier layer micro cracking in a critical test area (e.g., center). While present preforms may have micro cracks in the barrier layer due to how they are manufactured, the implementations described herein may avoid any stresses in the center of the barrier layer. This design may prevent metal from seeping through the barrier layer and onto the test fixture surface.

In various embodiments, the thermally conductive cladding layer 124 may be mechanically attached (i.e., pressure attached), chemically attached, or adhesively attached (e.g. through solder paste or powders) to the barrier layer 112-1.

In embodiments where the thermally conductive cladding layer 124-1 is mechanically attached, it may be mechanically attached at predetermined locations. For example, the thermally conductive cladding layer 124-1 may be attached to the barrier layer 112-1 along its perimeter, by its corners, and/or at points spaced evenly or unevenly about its surface. Moreover, the thermally conductive cladding layer 124-1 may be attached by using attachment lines across its surface (e.g., horizontally, vertically, diagonally, or a combination thereof), or by other attachment patterns.

In embodiments, methods of chemical or adhesive attachment methods may also be used to secure the thermally conductive cladding layer 124-1 to the barrier layer 112-1. For example, adhesives such as thermal adhesives in paste (e.g., epoxy resins), powder, tape (e.g., cyanoacrylate) or other form, can be used. The adhesives can be applied in dots, strips, or other patterns to adhere the thermally conductive cladding layer 124-1 to the barrier layer 112-1.

In embodiments, the thermally conductive cladding layer 124-1 may be comprised of metal or a metal alloy, such as, for example, indium or indium alloy. Other metals may be implemented including but not limited to tin (Sb), tin alloy, lead (Pb), gold (Au), silver (Ag), gallium (Ga), germanium (Ge), or a combination thereof. For the thermally conductive cladding layer 124-1, indium (In) is noted as a superior thermally conductive material, although other metals/alloys or composite materials that also have acceptable thermally conductive properties may be used. Indeed, any metal or metal alloy with a combination of plasticity (i.e., low flow strength) and enhanced thermal conductivity can be implemented as the thermally conductive cladding layer 124-1. Furthermore, composites with a similar set of properties, such as indium alloys with copper or silver wire mesh, layered metals, and compressed powder alloys may be used as the thermally conductive cladding layer 124-1.

In embodiments, the barrier layer 112-1 may be comprised of a metal or metal alloy, such as, for example, aluminum or aluminum alloy. In various embodiments, other metals may be implemented when forming the barrier layer 112-1 including but not limited to copper (Cu), copper-zinc alloy (Cu—Zn or "brass"), or a combination thereof. Indeed, metals or metal alloys that can be formed into very thin layers and that can withstand excessive heat during testing (i.e., those that do not melt or reflow) and/or prevent the thermally conductive material from adhering to a semiconductor component being tested (e.g., microprocessor chip) may be implemented may be implemented.

Figure 1B:
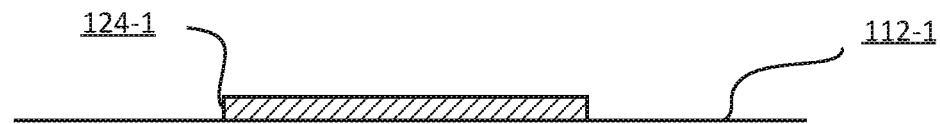
FIG. 1B illustrates a different orientation of an example burn-in solder preform according to embodiments of the disclosure.

FIG. 1B provides a side view of the solder burn-in preform 100-1 in accordance with embodiments of the disclosure. The embodiments disclosed herein can be implemented to provide cost advantages over prior solutions. For example, because the thermally conductive cladding layer 124-1 need not cover the entire area of barrier layer 112-1, less cladding material can be used thereby saving material cost. In various embodiments, the thermally conductive cladding layer 124-1 may be centered on the relatively thinner barrier layer 112-1 such that the barrier layer 112-1 extends beyond the outer edge of the thermally conductive cladding layer 124-1. Such alignment prevents the thermally conductive cladding layer 124-1 material from coming into contact with the RTD sensors during testing, and furthermore, prevents the thermally conductive cladding layer 124-1 from adhering to the semiconductor device (e.g., microprocessor chip) during the testing process.

In embodiments, the thickness of the thermally conductive cladding layer 124-1 can be any thickness specified by the end user. For example, the thickness of the thermally conductive cladding layer 124-1 could be from about 0.0001 inches to about 0.1 inches thick. Likewise, the thermally conductive cladding layer 124-1 may be of any length and width specified by the end user. For example, the thermally conductive cladding layer 124-1 may be from about 0.001 inches to about 10.0 inches in length, and from about 0.001 inches to about 10.00 inches in width.

Additionally, the thickness of the barrier layer 112-1 can be any thickness specified by the end user. For example, the thickness of the barrier layer 112-1 could be from about 0.0001 inches to about 0.1 inches thick. Likewise, the barrier layer 112-1 may be of any length and width specified by the end user. For example, the barrier layer 112-1 may be from about 0.001 inches to about 10.0 inches in length, and from about 0.001 inches to about 10.00 inches in width.

As noted above, the drawing are not necessarily made to scale and the dimensions of the components can be selected by the user as appropriate for the given application. In one example, the center thermally conductive layer 124-1 is 18 mm×18 mm square and 0.254 mm in thickness. However, the center thermally conductive layer 124-1 can be of any X, Y and Z dimension or any shape. Likewise the barrier layer 112-1 may also be of any X, Y and Z dimension or any shape. As one of ordinary sill in the art will appreciate after reading this description, the dimensions of the thermally conductive cladding layer 124-1 and the barrier layer 112-1 may be selected depending on the application and are generally governed by the test application with which the preform is used.

Figure 1C:
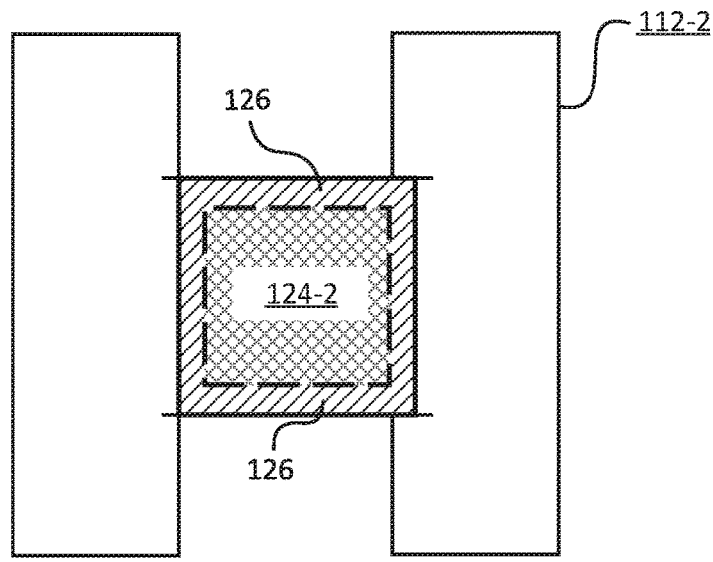
FIG. 1C illustrates an example burn-in solder preform according to embodiments of the disclosure.
Figure 1D:
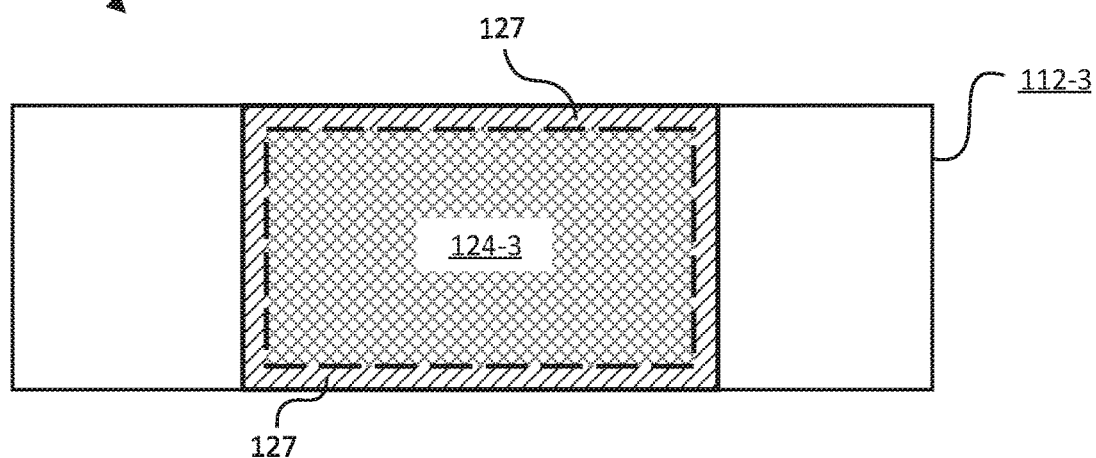
FIG. 1D illustrates an example burn-in solder preform according to embodiments of the disclosure.
Figure 1E:
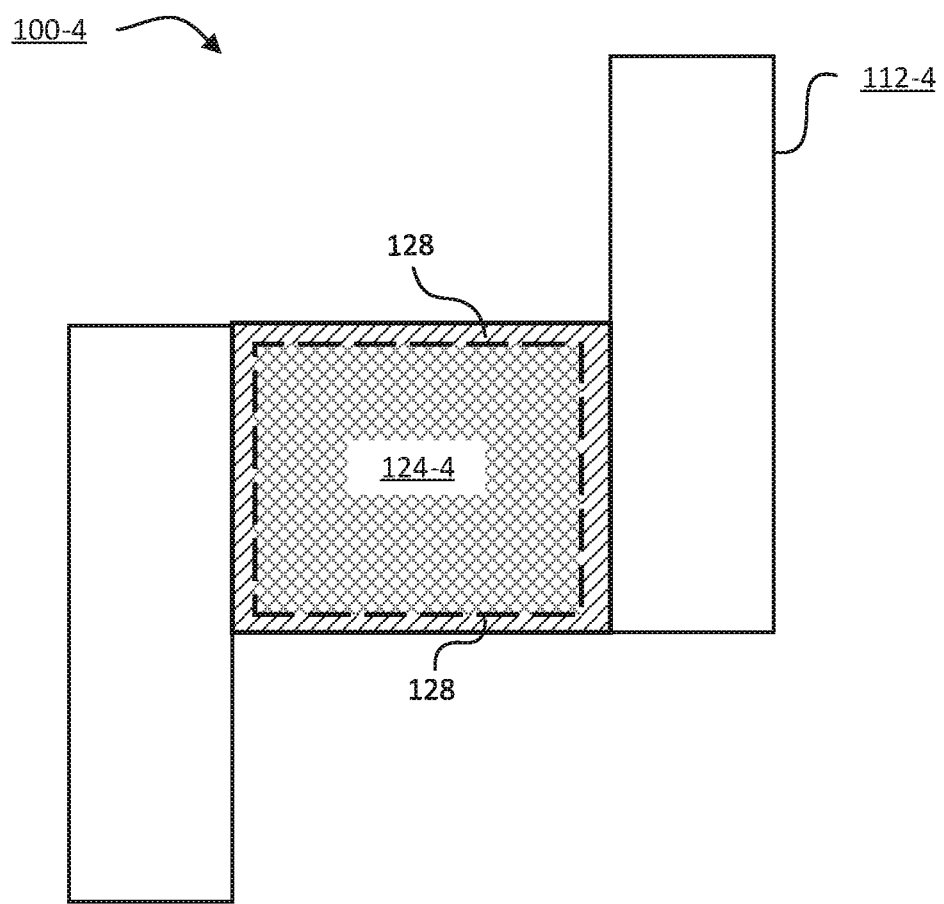
FIG. 1E illustrates an example burn-in solder preform according to embodiments of the disclosure.

FIGS. 1C-1E illustrate additional example burn-in solder preforms according to embodiments of the disclosure. In embodiments, as in the example preform shown in FIG. 1C, the barrier layer 112-2 may be cut in the shape of an I ("I-shaped"), where the thermally conductive cladding layer 124-2 may be placed in the center of the "I-shaped" barrier layer 112-2. In the illustrated example, thermally conductive cladding 124-2 is pre-attached to barrier layer 112-2 in pre-attachment area 126.

In various embodiments, as in the example preform shown in FIG. 1D, the barrier layer 112-3 may be cut in the shape of a rectangle, where the thermally conductive cladding layer 124-3 may be placed on top and in the center of the "rectangular-shaped" barrier layer 112-3. In the illustrated example, thermally conductive cladding 124-3 is pre-attached to barrier layer 112-3 in pre-attachment area 127. In various embodiments, as in the example preform shown in FIG. 1E, the barrier layer 112-3 may be cut in the shape of a tetromino (i.e., "tetris-shaped"), where the thermally conductive cladding layer 124-4 may be placed on top and in the center of the "tetris-shaped" barrier layer 112-4. In the illustrated example, thermally conductive cladding 124-4 is pre-attached to barrier layer 112-4 in pre-attachment area 128.

It should be appreciated that the preform shapes illustrated in FIGS. 1A-E are meant to provide examples of possible burn-in preform configurations and are not meant to be limiting. Other configurations and shapes may be implemented.

Figure 2:
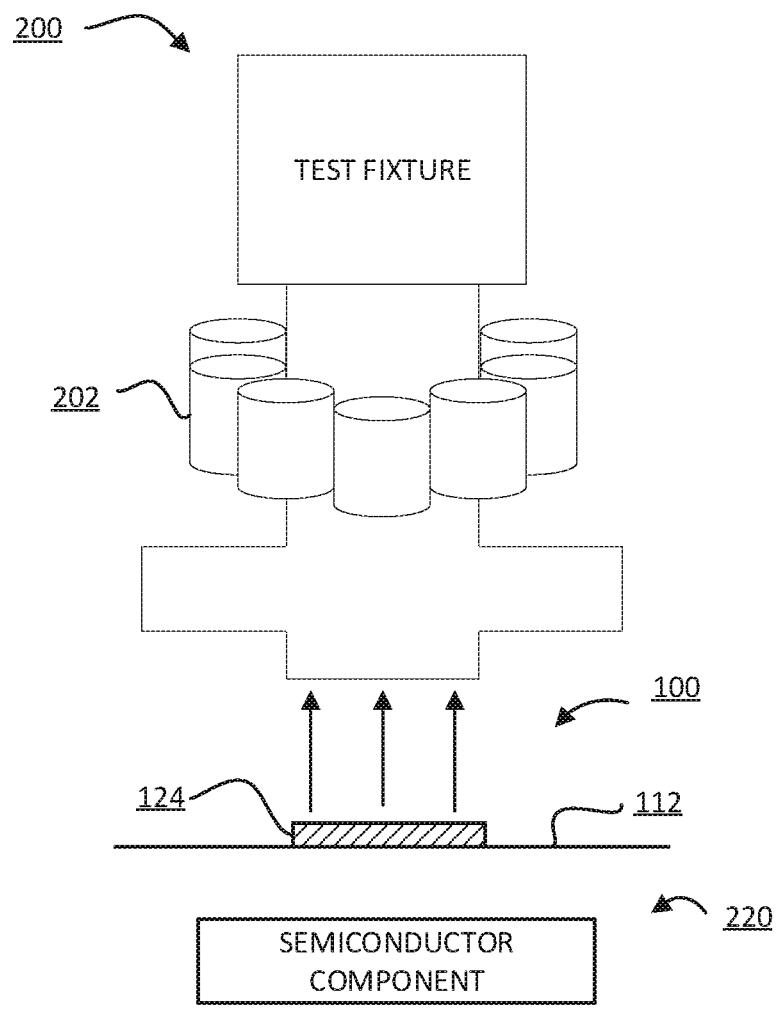
FIG. 2 illustrates an example system in which embodiments of the disclosure may be implemented.

FIG. 2 illustrates an example system in which embodiments of the disclosure may be implemented. By way of example, test fixture 200 with a plurality of RTDs 202, semiconductor component 220, and burn-in preform 100 are illustrated. Test fixture 200 may include multiple different sensors (i.e., voltage sensors, temperature sensors, etc.) for post-production analysis and is not limited to the plurality of RTDs 202 depicted.

The burn-in preform 100, comprising the thermally conductive cladding layer 124 and barrier layer 112, may be secured to test fixture 200 prior to performing post-test analysis on semiconductor component 220 (e.g., microprocessor chips, photocells, solar cells, laser diodes, etc.). Burn-in preform 100 may be oriented between test fixture 200 and semiconductor component 220 such that the barrier layer 112 expands beyond the thermally conductive cladding layer 124 (as depicted in FIG. 2), and protects both the plurality of RTDs 202 and semiconductor component 220 from direct contact with the thermally conductive cladding layer 124. Because the thermally conductive cladding layer 124 does not come into contact with the plurality of RTDs 202, a more accurate testing of the semiconductor device 220 is possible.

Barrier layer 112 may enclose the thermally conductive cladding layer 124 once attached to test fixture 200. This may reduce the likelihood that the thermally conductive material will reflow/melt on the plurality of RTDs 202 located on the side of test fixture 200. Because the thermally conductive cladding layer 124 is pre-attached to barrier layer 112, user handling may also be simplified when fitting test fixture 200 with the burn-in preform 100.

Figure 3:
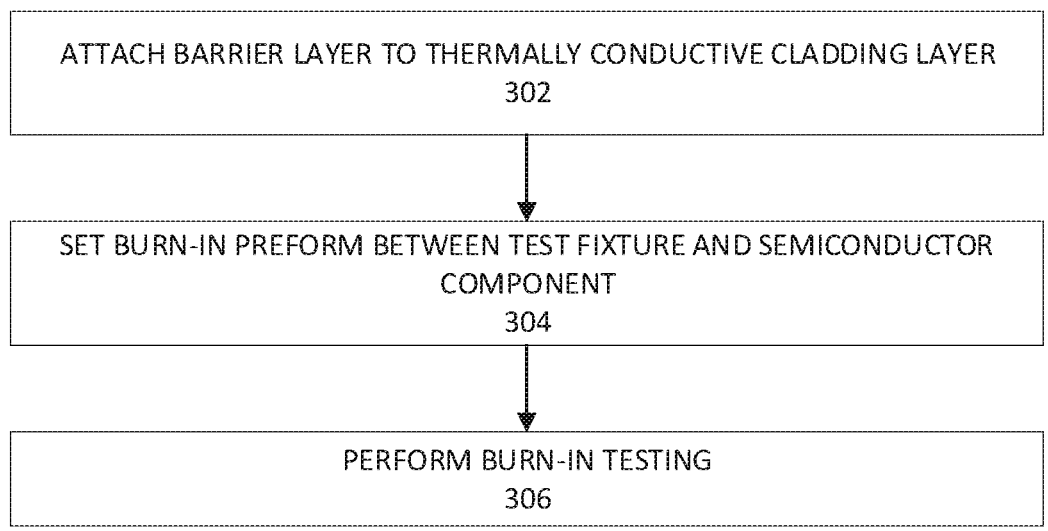
FIG. 3 is an operational flow diagram illustrating an example method of forming and using a burn-in preform during burn-in testing, in accordance with implementations of the disclosure.

FIG. 3 is an operational flow diagram illustrating an example method 300 of forming and using a burn-in preform 100 during burn-in testing, in accordance with implementations of the disclosure. The operations and sub-operations of method 300 may be carried out, in some cases, by and/or using one or more of the components, elements, devices, and sub-components of test fixture 200, and/or semiconductor component 220 (including components thereof as described above), as described with respect to at least FIGS. 1A-E and FIG. 2, as well as components, elements, devices, and sub-components, depicted therein and/or described with respect thereto.

At operation 302, a thermally conductive cladding layer 124 is attached to the barrier layer 112 around all or part of the outer edge of the thermally conductive cladding layer 124 forming a burn-in preform. In embodiments, the thermally conductive cladding layer 124 may be continuously attached or spot attached to the barrier layer 112. In various embodiments, the thermally conductive cladding layer 124 may be mechanically attached (i.e., pressure attached), chemically attached, or adhesively attached (e.g. through solder paste or powders) to the barrier layer 112. In various embodiments, attachment points are limited to discrete attachment locations such that the entire thermally conductive cladding layer 124 is not 100% attached to the barrier layer 112 forming a composite material. For example, the thermally conductive cladding layer 124 may be attached to the barrier layer 112 around its edges (e.g., in in one embodiment limited to only the edges), or at specific locations along the thermally conductive cladding layer 124.

In embodiments, operation 302 may include attaching the thermally conductive cladding layer 124 to the barrier layer 112 such that the thermally conductive cladding layer 124 is centered on top of the barrier layer 112 to form a burn-in preform. Attaching the thermally conductive cladding layer 124 to the barrier layer 112 in this fashion may facilitate better handling and ease of use of the burn-in preform.

At operation 304, the burn-in preform of operation 302 may be secured to the test fixture 200. In embodiments, the burn-in preform of operation 302 may be secured to the test fixture 200 through a number of means including but not limited to mechanical attachment (e.g., clamping, physical pressure, rubber bands), chemical attachment (e.g., glue), or adhesive attachment (e.g., tape). In particular implementations, the burn-in preform may be secured to the test fixture 200 by folding up portions of a barrier layer 112 not covered with thermally conductive cladding layer 124 to attach to the head of the test fixture. For example, in the case of preform 100-1, the four non-centered ends of barrier layer 112-1 may fold up to attach to a head of test fixture 200. As another example, in the case of preform 100-3, the two non-centered ends of barrier layer 112-3 may fold up and be wrapped around the test fixture 200 for attachment.

In embodiments, the burn-in preform of operation 302 may be secured to the test fixture 200 such that the thermally conductive cladding layer 124 is shielded from the RSDs (located on the side of the test fixture head in reference to FIG. 2) and the semiconductor component 220 by the barrier layer 112. In various embodiments, the burn-in preform of operation 302 is secured between the test fixture 200 and the semiconductor component 220 such that the barrier layer 112 may be oriented down towards the semiconductor component 220.

At operation 306, after securing the burn-in preform, burn-in testing of the semiconductor component 220 may be performed. During burn-in testing, barrier layer 112 may be configured to act as a barrier that prevents the thermally conductive cladding layer 124 from reflow/melting onto semiconductor component 220. Moreover, during burn-in testing, barrier layer 112 may be configured to act as a barrier that prevents the thermally conductive cladding layer 124 from reflow/melting onto RTDs 202 attached to test fixture 200.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A burn-in solder preform comprising:
   a barrier layer configured to prevent thermally conductive material of a thermally conductive cladding layer from adhering to a semiconductor component, wherein one or more first portions of the barrier layer not covered by the thermally conductive cladding layer are configured to be folded around and attached to a head of a test fixture used to perform burn-in testing of the semiconductor component; and
   the thermally conductive cladding layer attached over a center portion of the barrier layer, the thermally conductive cladding layer dimensioned such that it does not extend past the center portion and such that the one or more first portions of the barrier layer extend past the thermally conductive cladding layer, wherein the thermally conductive cladding layer is attached over the barrier layer through continuous or spot attachment.

2. The burn-in solder preform of claim 1, wherein the continuous attachment comprises mechanical attachment around all or part of an outer edge of the thermally conductive cladding layer.

3. The burn-in solder preform of claim 2, wherein the mechanical attachment comprises pressure attachment.

4. The burn-in solder preform of claim 1, wherein the spot attachment comprises mechanical attachment around all or part of an outer edge of the thermally conductive cladding layer.

5. The burn-in solder preform of claim 1, wherein the barrier layer is comprised of a metal or a metal alloy.

6. The burn-in solder preform of claim 5, wherein the barrier layer comprises aluminum (Al), an aluminum alloy, copper (Cu), a copper-zinc alloy, or a combination thereof.

7. The burn-in solder preform of claim 5, wherein the barrier layer comprises Al or an Al alloy, and wherein the thermally conductive cladding layer comprises indium (In) or an In alloy.

8. The burn-in solder preform of claim 7, wherein the thermally conductive cladding layer is spot attached along edges to the barrier layer.

9. The burn-in solder preform of claim 8, wherein the preform consists of the barrier layer and the thermally conductive cladding layer.

10. A method of making a burn-in solder preform, the method comprising: continuously attaching or spot attaching a thermally conductive cladding layer over a center portion of a barrier layer such that one or more other portions of the barrier layer extend past the thermally conductive cladding layer and are not covered by the thermally conductive cladding layer, wherein the thermally conductive cladding layer is dimensioned such that it does not extend past the center portion of the barrier layer, wherein the one or more other portions of the barrier layer are configured to be folded around and attached to a head of a test fixture used to perform burn-in testing of a semiconductor component, wherein the barrier layer is configured to prevent thermally conductive material of the thermally conductive cladding layer from adhering to the semiconductor component.

11. The method of claim 10, wherein the barrier layer is continuously attached around all or part of the outer edge of the thermally conductive cladding layer.

12. The method of claim 10, wherein the barrier layer is spot attached around all or part of the outer edge of the thermally conductive cladding layer.

13. The method of claim 10, wherein the barrier layer comprises a metal or metal alloy.

14. The method of claim 13, wherein the barrier layer comprises aluminum (Al), an aluminum alloy, copper (Cu), a copper-zinc alloy, or a combination thereof.

15. The method of claim 10, wherein the thermally conductive cladding layer comprises a metal or metal alloy.

16. The method of claim 15, wherein the thermally conductive cladding layer comprises indium (In), an indium alloy, a tin (Sb), tin alloy, lead (Pb), gold (Au), silver (Ag), gallium (Ga), germanium (Ge), or a combination thereof.

17. A method, comprising:
    attaching a thermally conductive cladding layer over a center of a barrier layer to form a burn-in solder preform, wherein after attachment, at least one dimension of the barrier layer extends past the thermally conductive cladding layer;
    placing the burn-in solder preform between a test fixture and a semiconductor component;
    attaching the portion of the barrier layer of the burn-in solder preform to a head of the test fixture; and
    after attaching the portion of the barrier layer of the burn-in solder preform to the head of the test fixture, performing burn-in testing of the semiconductor component.

18. The method of claim 17, wherein attaching the portion of the barrier layer to the head of the text fixture, comprises: folding up portions of the barrier layer not covered with the thermally conductive cladding layer to attach to the head of the test fixture.

19. The method of claim 17, wherein the semiconductor component is a microprocessor chip, wherein the test fixture comprises a plurality of resistance temperature detectors (RTDs).

20. The method of claim 17, wherein the barrier layer comprises aluminum or an aluminum alloy, wherein the thermally conductive cladding layer comprises indium or an indium alloy.

* * * * *